US012720799B2

(12) United States Patent
Nishimura

(10) Patent No.: US 12,720,799 B2
(45) Date of Patent: Aug. 25, 2026

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Takeyoshi Nishimura, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 354 days.

(21) Appl. No.: 18/587,778

(22) Filed: Feb. 26, 2024

(65) Prior Publication Data

US 2024/0371993 A1 Nov. 7, 2024

(30) Foreign Application Priority Data

May 2, 2023 (JP) ................................ 2023-076310

(51) Int. Cl.
*H10D 30/66* (2025.01)
*H10D 30/01* (2025.01)

(52) U.S. Cl.
CPC ....... *H10D 30/668* (2025.01); *H10D 30/0297* (2025.01)

(58) Field of Classification Search
CPC ............. H10D 30/668; H10D 30/0297; H10D 64/2527; H10D 30/665; H10D 62/105; H10D 62/112; H10D 62/155; H10W 72/5524; H10W 72/59; H10W 20/484
USPC .......................................................... 257/330
See application file for complete search history.

(56) References Cited

U.S. PATENT DOCUMENTS 7,034,357 B2 * 4/2006 Matsudai ............. H10D 62/393 257/E29.066
11,942,517 B2 * 3/2024 Masuda ............... H10D 62/111
2009/0267142 A1 10/2009 Otani
2011/0142089 A1 6/2011 Kudo
2014/0227813 A1 8/2014 Yoneda et al.
2022/0049357 A1 2/2022 Sunamoto et al.

FOREIGN PATENT DOCUMENTS

JP H06-260509 A 9/1994
JP 2001-025106 A 1/2001
JP 2003-101024 A 4/2003

(Continued)

*Primary Examiner* — Theresa T Doan
(74) *Attorney, Agent, or Firm* — Rabin & Berdo, P.C.

(57) ABSTRACT

A semiconductor device, including: a semiconductor substrate, a drift layer provided on the semiconductor substrate, a base layer provided in the drift layer at a surface thereof, a plurality of source regions selectively provided in the base layer at a surface thereof, a plurality of gate electrodes provided in the base layer and the source regions via a plurality of gate insulating films, respectively, an interlayer insulating film covering the source regions and the gate electrodes, a plurality of contact holes provided in the interlayer insulating film and in the source regions at the surfaces thereof, and a front electrode provided on the interlayer insulating film. A longitudinal direction of each contact hole is a first direction. The front electrode includes an upper electrode provided on a lower electrode, the upper electrode having a plurality of recesses formed therein each extending in a second direction orthogonal to the first direction.

14 Claims, 16 Drawing Sheets

(56) References Cited

FOREIGN PATENT DOCUMENTS

| | | | |
|---|---|---|---|
| JP | 2009-266935 | A | 11/2009 |
| JP | 2011-124442 | A | 6/2011 |
| JP | 6307907 | B2 | 4/2018 |
| JP | 7170849 | B2 | 11/2022 |

* cited by examiner 50
55
60
16
15
14
10b
10
10a
22
13
26
9
9
6
33
5
7
8
18
p
n+ p++
p-
20
23
24
n
2
n+
1
11

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2023-076310, filed on May 2, 2023, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

In a known semiconductor device, multiple recesses are formed in an electrode layer to suppress the occurrence of cracks due to stress concentrating in a particular area of the electrode layer (for example, refer to Japanese Laid-Open Patent Publication No. 2009-266935). Further, in another known semiconductor device, to increase the strength of adhesion to a lead, a SOG film is embedded in a recessed portion of a source electrode and the electrode surface is planarized (for example, refer to Japanese Laid-Open Patent Publication No. 2003-101024).

SUMMARY OF THE INVENTION

According to an embodiment of the present invention, a semiconductor device includes: a semiconductor substrate of a first conductivity type and having a first main surface and a second main surface opposite to each other; a drift layer of the first conductivity type, provided on the first main surface of the semiconductor substrate; a base layer of a second conductivity type, provided in the drift layer at a surface thereof; a plurality of source regions of the first conductivity type, selectively provided in the base layer at a surface thereof; a plurality of gate electrodes, provided at the surface of the base layer and surfaces of the plurality of source regions, via a plurality of gate insulating films, respectively; an interlayer insulating film covering the plurality of source regions and the plurality of gate electrodes; a plurality of contact holes provided in the interlayer insulating film and in the plurality of source regions at the surfaces thereof, a longitudinal direction of each of the plurality of contact holes being a first direction; and a front electrode provided on the interlayer insulating film. The front electrode is configured by a lower electrode provided on the interlayer insulating film, and an upper electrode provided on the lower electrode, the upper electrode having a plurality of recesses formed therein each extending in a second direction orthogonal to the first direction.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
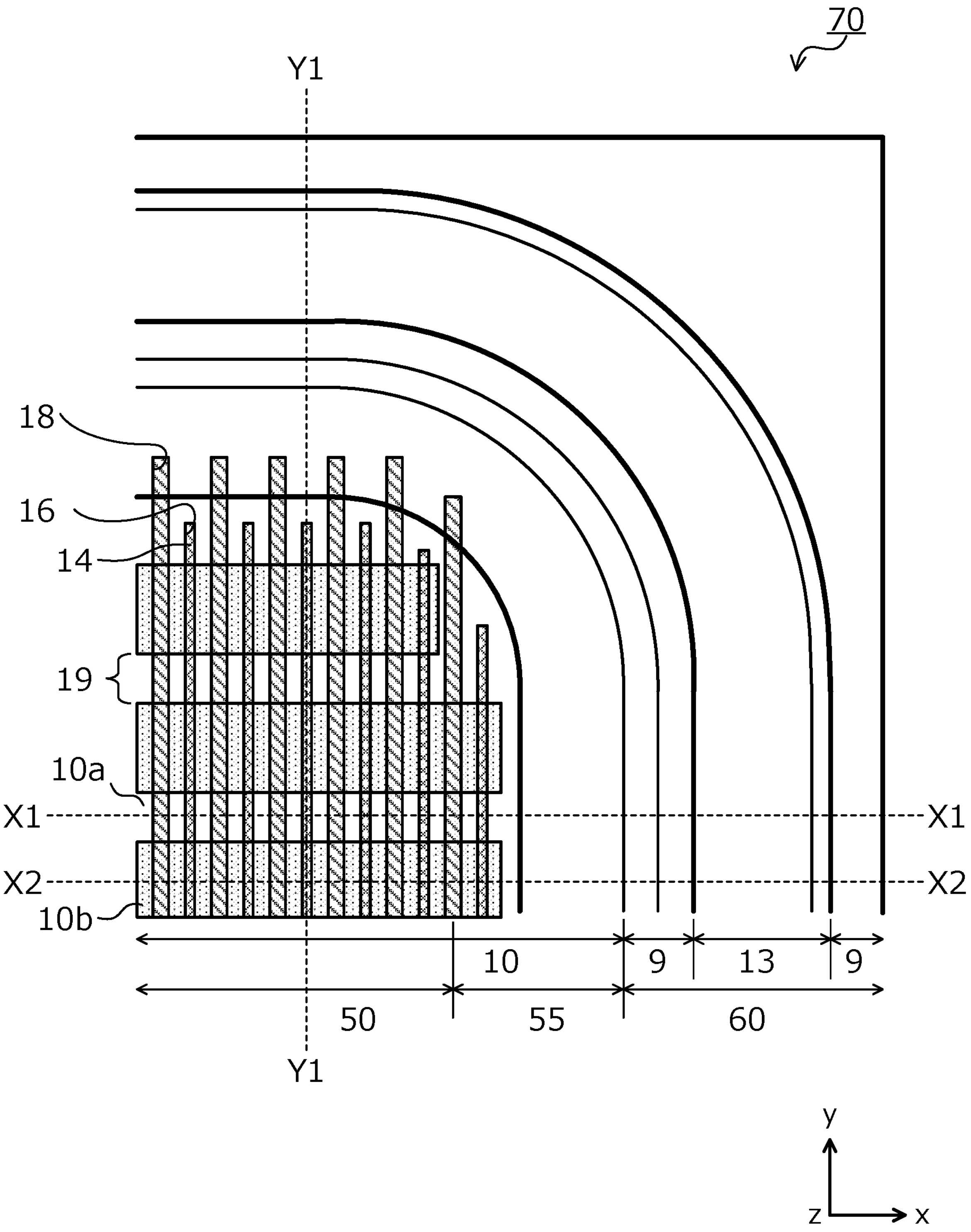
FIG. 1 is an enlarged plan view depicting a structure of a semiconductor device according to a first embodiment.

First, problems associated with the conventional techniques are discussed. With the conventional semiconductor devices, a problem arises in that while on-resistance of the semiconductor chip itself decreases with increased miniaturization, surface electrode resistance of the semiconductor chip can no longer be disregarded.

Embodiments of a semiconductor device and a method of manufacturing a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − that are the same indicate that concentrations are close and therefore, the concentrations are not necessarily equal. In the description of the embodiments below and the accompanying drawings, main portions that are identical are given the same reference numerals and are not repeatedly described. Further, with consideration of variation in manufacturing, description indicating the same or equal may be within 5%.

First, a conventional semiconductor device is described. As described above, in the conventional semiconductor device, the on-resistance (on-voltage) of semiconductor chips themselves is decreasing accompanying improvements in design and processing accuracy with miniaturization, etc. As a result, the resistance of a surface electrode of a semiconductor chip connecting a substrate of the semiconductor chip and an external electrode can no longer be disregarded. In particular, lateral (in-plane) resistance of the surface electrode is large. A thickness of a metal film of the surface electrode is increased, whereby the resistance of the surface electrode decreases, concentration of current is mitigated, and tolerance may be improved. Nonetheless, by increasing the thickness of the metal film, equipment capacity decreases, processing accuracy decreases, design changes, etc. are necessary and thus, the thickness of the metal film can only be reduced a certain extent. As a result, wire diameter and/or the number of wires connected to the surface electrode are increased, a plated electrode is formed at the surface of the metal film, etc.

In an instance in which the wire diameter and/or the number of wires are increased, not only does a wire resistance component decrease but this instance is equivalent to the metal film of a portion where the wires are bonded becoming thicker (the wires being significantly thicker as compared to the metal film of the semiconductor chip) and thin regions of the metal film decreasing, the concentration of current is suppressed, and tolerance is improved. Further, the metal film becomes thicker, whereby damage caused by wire bonding is reduced and thus, reliability of the semiconductor chip is also improved.

Further, in an instance in which a plated electrode is formed on the metal film of the semiconductor chip, the plated electrode, which is thick as compared to the metal film, is deposited and thus, the surface electrode becomes thick, thereby enabling reduction of the resistance of the surface electrode. In actuality, a solder layer is also formed on the plated electrode and thus, while drops in the surface electrode resistance are rare, wire resistance and an L (inductance) component decrease. Further, by expanding the cross-sectional area of the current path, the current path may also act as a ballast resistor to suppress current concentration and improve tolerance.

Nonetheless, due to wire bonding equipment and package constraints, there are limitations on the wire diameter and the number of wires; and decrease of the surface electrode resistance is also limited. Further, for the reasons described above, there are limitations on the thickness of the metal film of the semiconductor chip and damage due to bonding wiring with a diameter significantly thicker than the metal film is not sufficiently reduced. Thus, while stitch bonding and ribbon wire are also available as improvement methods amid such limitations, a problem arises in that with the increase in the number of bonds and the increase in the bonding area, not only does cost increase but damage from wire bonding also increases, whereby reliability of the semiconductor chip decreases.

Furthermore, when the configuration includes a plated electrode and a solder layer, problems arise in that while the plated electrode and the solder layer are thick, resistivity is high as compared to that of the metal film of the semiconductor chip and thus, the effect of reducing resistance by the plated electrode and solder layer is low; the plating solution contains a large amount of metal ions, which penetrate the semiconductor chip and thus, the reliability of the semiconductor chip decreases.

Figure 2:
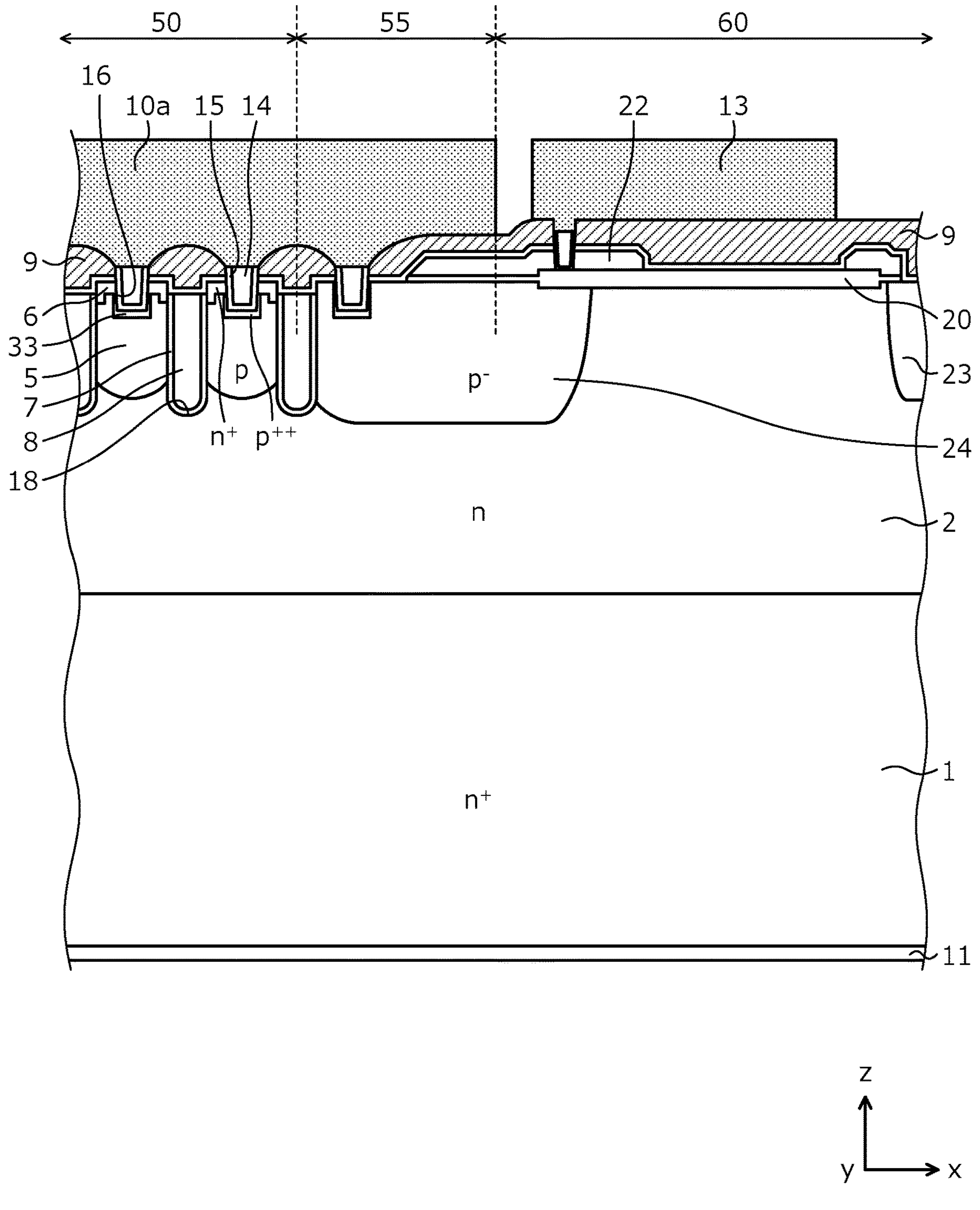
FIG. 2 is a cross-sectional view depicting the structure of the semiconductor device according to the first embodiment along cutting line X1-X1 in FIG. 1.
Figure 3:
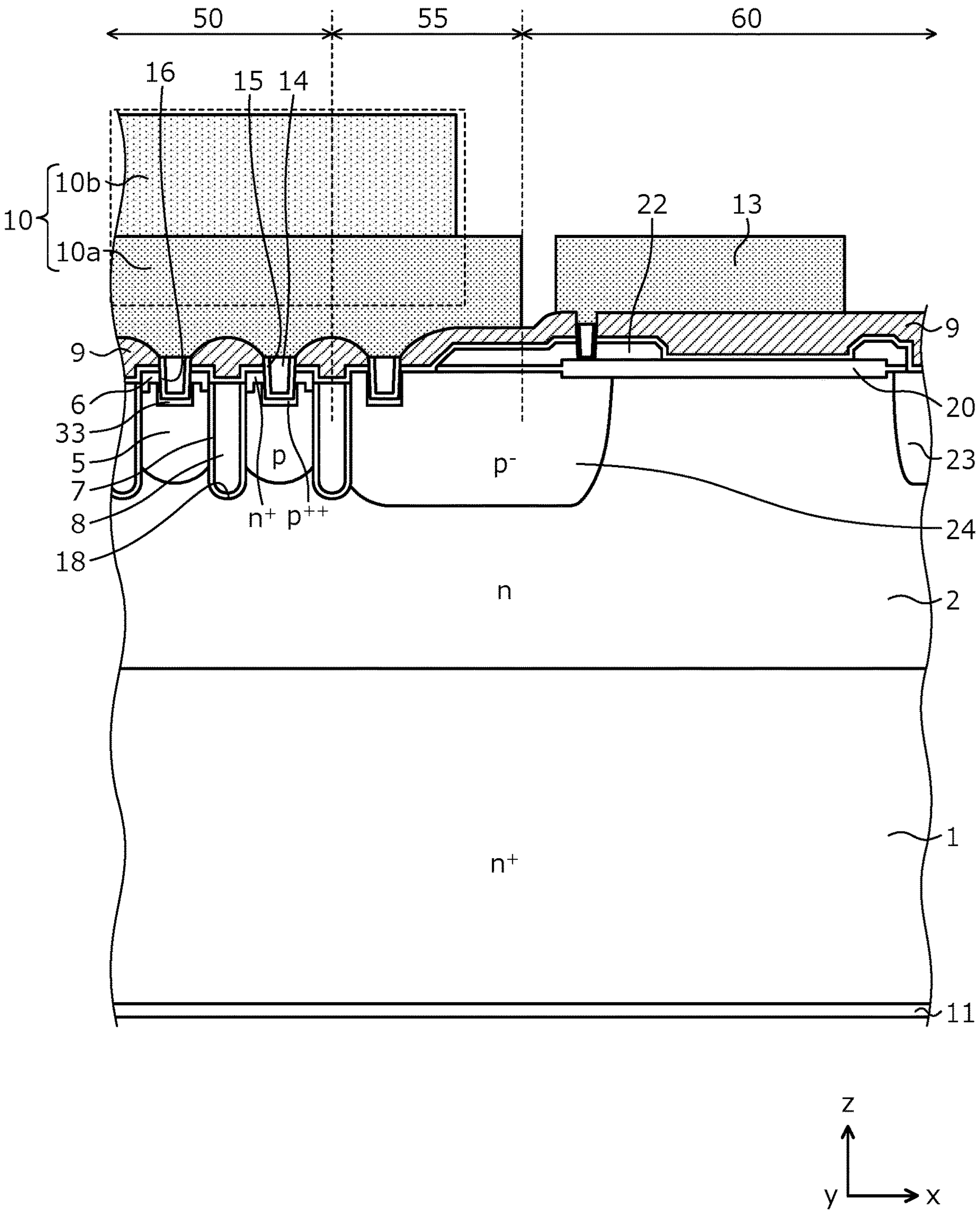
FIG. 3 is a cross-sectional view depicting the structure of the semiconductor device according to the first embodiment along cutting line X2-X2 in FIG. 1.
Figure 4:
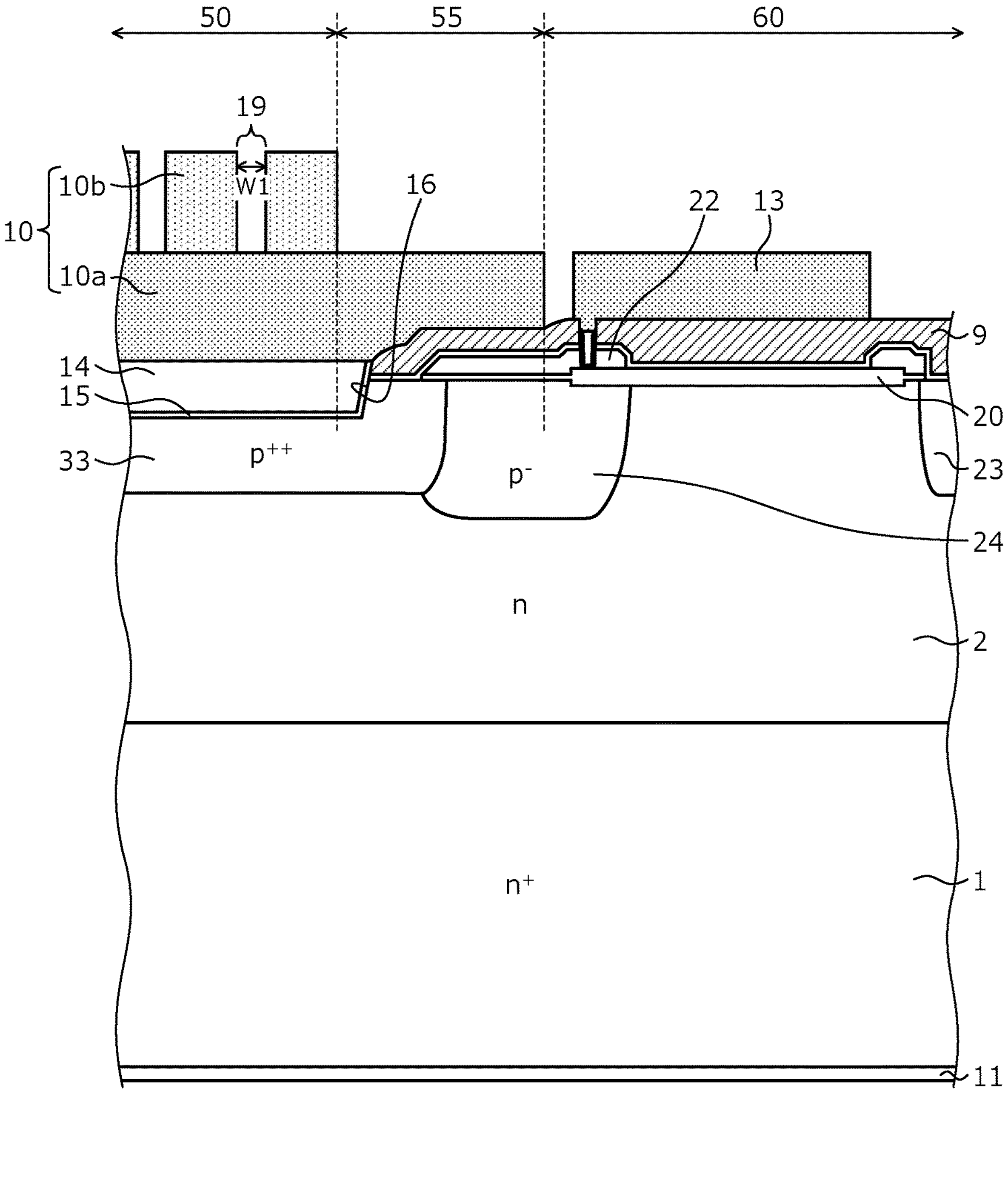
FIG. 4 is a cross-sectional view depicting the structure of the semiconductor device according to the first embodiment along cutting line Y1-Y1 in FIG. 1.

A semiconductor device and a method of manufacturing a semiconductor device according to a first embodiment to at least solve the problems above are described. FIG. 1 is an enlarged plan view depicting a structure of the semiconductor device according to the first embodiment. FIG. 2 is a cross-sectional view depicting the structure of the semiconductor device according to the first embodiment along cutting line X1-X1 in FIG. 1. FIG. 3 is a cross-sectional view depicting the structure of the semiconductor device according to the first embodiment along cutting line X2-X2 in FIG. 1. FIG. 4 is a cross-sectional view depicting the structure of the semiconductor device according to the first embodiment along cutting line Y1-Y1 in FIG. 1. The structure of the semiconductor device according to the first embodiment is described taking a trench-type MOSFET 70 as an example.

The trench-type MOSFET 70 is a MOSFET with a semiconductor chip (silicon chip) containing silicon (Si) and metal oxide semiconductor (MOS) gates provided in the semiconductor chip, at a front surface thereof (surface having a later-described p-type base layer 5). The trench-type MOSFET 70, as depicted in FIGS. 1, 2, 3, and 4, has an active region 50, a peripheral active region portion 55, and an edge termination region 60 surrounding a periphery of the peripheral active region portion 55 and the active region 50. The active region 50 and the peripheral active region portion 55 are regions through which current flows during an on-state. The edge termination region 60 includes a breakdown voltage sustaining region that mitigates electric field of a front side of a drift region and sustains a breakdown voltage. The MOS structure is provided in the active region 50 while the peripheral active region portion 55 is free of the MOS structure.

A border between the active region 50 and the peripheral active region portion 55 is a center of one of multiple trenches 18, the one trench 18 having only one side in contact with one of later-described $n^+$-type source regions 6. A border between the peripheral active region portion 55 and the edge termination region 60 is an end of a later-described source electrode 10. In the active region 50 depicted in FIGS. 2 and 3, two unit cells (functional units of the device) are depicted while other adjacent unit cells adjacent thereto are not depicted. Here, a unit cell is from a center of any one of the trenches 18 to a center of an adjacent one the trenches 18.

An $n^+$-type semiconductor substrate (semiconductor substrate of a first conductivity type) 1 is a single crystal silicon substrate doped with, for example, arsenic (As) or phosphorus (P). On the $n^+$-type semiconductor substrate 1, an n-type drift layer (drift layer of the first conductivity type) 2 is provided. The n-type drift layer 2 is a low-concentration n-type layer having an impurity concentration lower than an impurity concentration of the $n^+$-type semiconductor substrate 1 and, for example, is doped with phosphorus. The semiconductor substrate does not necessarily have to be an $n^+$-type and configuration may be such that the n-type drift layer 2 is the semiconductor substrate and an $n^+$-type region is provided at a lower surface of the n-type drift layer 2. Hereinafter, the $n^+$-type semiconductor substrate 1 and the n-type drift layer 2 combined are assumed to the semiconductor chip. An n-type buffer layer (not depicted) having an impurity concentration lower than the impurity concentration of the $n^+$-type semiconductor substrate 1 may be disposed on the $n^+$-type semiconductor substrate 1. The n-type buffer layer, for example, is a low-concentration n-type layer doped with phosphorus. In the semiconductor chip, at the front surface thereof, a MOS gate structure (device structure) is formed. Further, at a back surface of the semiconductor chip, a back electrode 11 constituting a drain electrode is provided.

The p-type base layer (base layer of the second conductivity type) 5 is provided in a surface layer of the n-type drift layer 2, and the $n^+$-type source regions (source regions of the first conductivity type) 6 are selectively provided in a surface layer of the p-type base layer 5. In the surface layer of the p-type base layer 5, $p^{++}$-type contact regions 33 in contact with the $n^+$-type source regions 6 may be selectively provided.

In the semiconductor chip, at a first main side thereof (side having the p-type base layer 5), a trench structure having a longitudinal direction in a y-direction is formed. The trench structure is configured by the trenches 18, gate insulating films 7, and gate electrodes 8. In particular, from a first surface (first main side of the semiconductor chip) of the p-type base layer 5, opposite to a second surface thereof facing the $n^+$-type semiconductor substrate 1, the trenches 18 penetrate through the p-type base layer 5 and the $n^+$-type source regions 6 and reach the n-type drift layer 2. In the trenches 18, along bottoms and sidewalls thereof, the gate insulating films 7 are formed and the gate electrodes 8 are provided on the gate insulating films 7 in the trenches 18. The gate electrodes 8 are insulated from the p-type base layer 5 by the gate insulating films 7. A portion of each of the gate electrodes 8 may protrude from tops of the trenches 18 (respective sides where the later-described source electrode 10 is provided) in a direction to the source electrode 10.

An interlayer insulating film 9 is provided in an entire area of a first main surface of the semiconductor chip so as to cover the gate electrodes 8 embedded in the trenches 18. In the interlayer insulating film 9, contact holes 16 having a longitudinal direction in the y-direction are formed. Each of the contact holes 16 has, for example, a stripe-shape extending in the y-direction. The source electrode (front electrode) 10 is in contact with the $n^+$-type source regions 6 and the p-type base layer 5 via the contact holes 16. At a surface of the p-type base layer 5 in contact with the source electrode 10 via the contact holes 16, the $p^{++}$-type contact regions 33 may be provided. The source electrode 10 is electrically insulated from the gate electrodes 8 by the interlayer insulating film 9. Between the source electrode 10 and the interlayer insulating film 9, for example, a barrier metal 15 that prevents diffusion of metal atoms from the source electrode 10 to the gate electrodes 8 may be provided.

Further, contact plugs 14 may be embedded in the contact holes 16 formed in the interlayer insulating film 9. The contact plugs 14, for example, are metal films containing, as a material, tungsten (W), which has high embeddability. In this case, while assumed as a trench contact structure, parasitic bipolar operation may be suppressed by drawing out holes of the p-type base layer 5 at a position deeper than are the $n^+$-type source regions 6, during avalanche, whereby breakdown voltage may be enhanced. Here, the trench contact structure is a contact structure in which trenches that penetrate through the $n^+$-type source regions 6 and are in contact with the $p^{++}$-type contact regions 33 are provided, and the contact holes 16 are provided so as to penetrate through the interlayer insulating film 9 and the $n^+$-type source regions 6 and be in contact with (reach) the $p^{++}$-type contact regions 33. On the source electrode 10, for example, a protective film (not depicted) such as a passivation film containing a polyimide is selectively provided.

Further, in the semiconductor chip, at the front surface thereof in the edge termination region 60 that maintains the breakdown voltage, the gate insulating films 7 and a field oxide film 20 are provided, and a conductive film 22 constituted by a polycrystalline silicon film connected to the gate electrodes 8 is provided on the field oxide film 20. The interlayer insulating film 9 is provided on the semiconductor chip and the conductive film 22. On the conductive film 22, a metal gate electrode 13 electrically connected to a gate electrode pad (not depicted) is provided. The metal gate electrode 13 is in contact with the conductive film 22 via the contact holes 16 formed in the interlayer insulating film 9 and is insulated from the semiconductor chip by the field oxide film 20. Between the metal gate electrode 13 and the interlayer insulating film 9, for example, the barrier metal 15, which prevents diffusion of metal atoms from the metal gate electrode 13 to the gate electrodes 8 may be provided. Further, the contact plugs 14 may be embedded in the contact holes 16 formed in the interlayer insulating film 9. The contact plugs 14, for example, are the metal films containing, as a material, tungsten (W), which has high embeddability.

Further, in the edge termination region 60, a voltage withstanding structure such as a $p^-$-type RESURF region 24, a p-type guard ring, etc. may be provided. Closer to an end of the semiconductor chip than is the voltage withstanding structure, a channel stopper 23 is provided, the channel stopper 23 being of an n-type and thereon, a field plate (not depicted) may be provided. The p-type RESURF region 24 and the channel stopper 23 may be provided in a ring-shape in an outer periphery of the semiconductor chip.

In the first embodiment, the source electrode 10 has a two-layer structure in which a first source electrode (lower electrode) 10$a$ is provided on the interlayer insulating film 9 and a second source electrode (upper electrode) 10$b$ is provided on the first source electrode 10*a*. The first source electrode 10*a* and the second source electrode 10*b* may be formed using, for example, Al—Si, Al—Si—Cu, Al—Cu as a material thereof. Further, Al has high interdiffusivity with the semiconductor chip and alloyed spikes are formed, degrading characteristics and thus, while it is undesirable for the first source electrode 10*a* to be formed containing Al, the second source electrode 10*b*, which is not directly in contact with the semiconductor chip, may be formed containing Al. Further, the second source electrode 10*b* may contain Cu or a Cu-based metal. Further, the first source electrode 10*a* and the second source electrode 10*b* have about a same thickness and each has a normal thickness for a source electrode, in a range of about 3 μm to 7 μm. Further, preferably, a surface of the first source electrode 10*a* in contact with the second source electrode 10*b* may be flatter than is the interlayer insulating film 9 and have minimal unevenness. Minimal unevenness of the surface means that a difference (distance) between a highest portion and a lowest portion of the surface of the n-type drift layer 2 is small.

Figure 5:
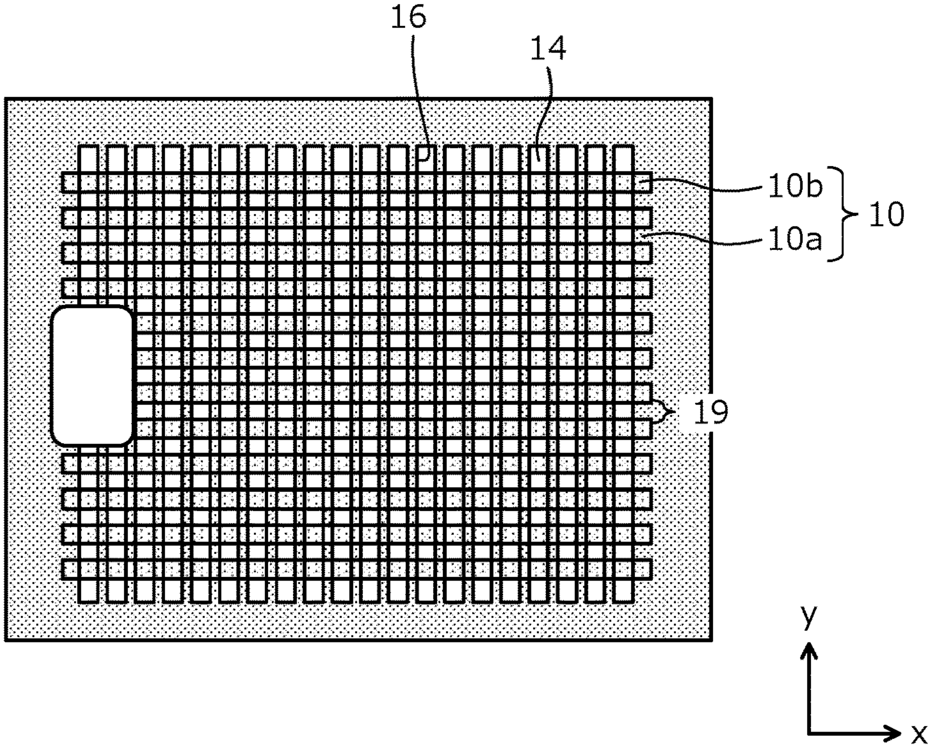
FIG. 5 is a plan view depicting the structure of the semiconductor device according to the first embodiment.
Figure 6:
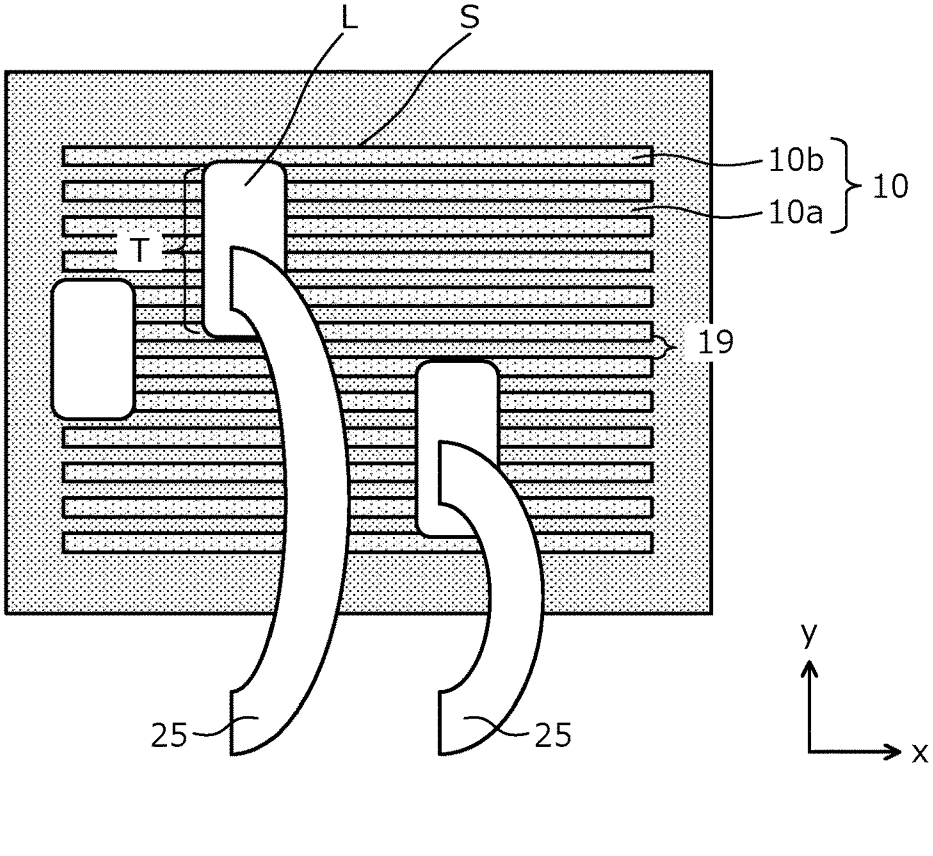
FIG. 6 is a plan view depicting the structure of the semiconductor device according to the first embodiment.

FIGS. 5 and 6 are plan views depicting the structure of the semiconductor device according to the first embodiment. As depicted FIG. 5, preferably, the second source electrode 10*b* may have recesses 19 that extend in a direction (x direction, second direction) orthogonal to the longitudinal direction of the contact holes 16 (y-direction, first direction). Each of the recesses 19, for example, has a stripe-shape with a longitudinal direction in the x direction. The recesses 19, for example, as depicted in FIG. 4, are portions on the first source electrode 10*a* free of the second source electrode 10*b*. Further, the recesses 19, for example, may be portions of the second source electrode 10*b* where the thickness thereof is thin on the first source electrode 10*a*.

Further, while the thickness of wires connected to the source electrode 10 is in a range of 100 μm to 500 μm, when the wires are inserted into the recesses 19, the thickness of the source electrode 10 decreases and thus, preferably, a width W1 of each of the recesses 19 (refer to FIG. 4) may be greater than a width of each of the unit cells but smaller than the thickness of the wires. Furthermore, preferably, a dimension of each of the recesses in a lengthwise direction may be greater than a diameter of the wire but smaller than a dimension of the active region. Further, preferably, a pitch in a lateral direction and represented by a sum of one of the recesses and a width of the second source electrode 10*b* may be two times greater than a size of a cell but less than a radius of the wires. The thickness of the wires connected to the source electrode 10 are significantly thicker as compared to the thicknesses of the first source electrode 10*a* and the second source electrode 10*b* and the width W1 of each of the recesses 19 and thus, during wire bonding, in the width W1 direction, the recesses 19 are filled and therefore, the source electrode beneath the wires does not become thin.

As described, in the first embodiment, a region is present that has a thickness that is about twice as thick as compared to a normal source electrode and current flowing in the thick region increases, whereby the resistance of the surface electrode constituted by the first source electrode 10*a* and the second source electrode 10*b* may be decreased.

Figure 3A:
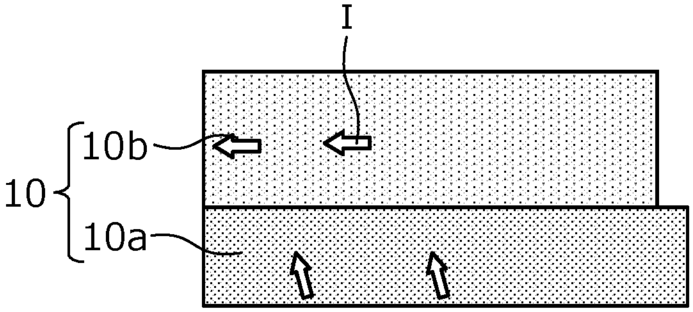
FIG. 3*a* is a cross-sectional view depicting current flow in the source electrode of the semiconductor device according to the first embodiment.

Here, FIG. 3*a* is a cross-sectional view depicting current flow in the source electrode of the semiconductor device according to the first embodiment. FIG. 3*a* is an enlarged view of a portion surrounded by a dashed line in FIG. 3. As depicted in FIG. 3*a*, in the first embodiment, the direction in which the recesses 19 extend and the longitudinal direction of the contact holes 16 are orthogonal to each other and thus, the second source electrode 10*b* may evenly draw out current I flowing through the first source electrode 10*a*.

Figure 3B:
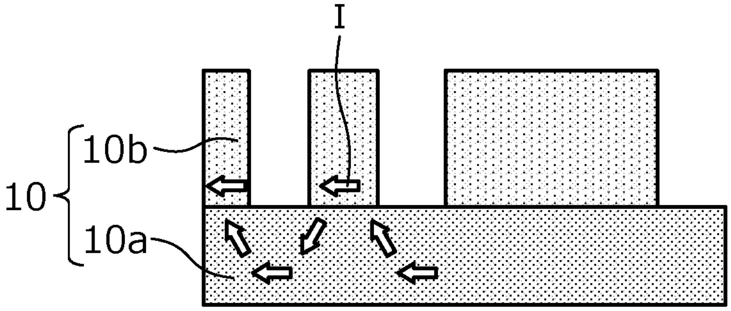
FIG. 3*b* is a cross-sectional view depicting the flow of current in a source electrode in an instance in which the direction in which the recesses extend and the longitudinal direction of the contact holes are parallel to each other.

In contrast, FIG. 3*b* is a cross-sectional view depicting the flow of current in a source electrode in an instance in which the direction in which the recesses extend and the longitudinal direction of the contact holes are parallel to each other. As depicted in FIG. 3*b*, in this instance, the recesses are present in the direction in which the current I flows and thus, even when the second source electrode 10*b* draws out the current I flowing through the first source electrode 10*a*, the current I has to return to the first source electrode 10*a* and the current I flowing in the first source electrode 10*a* cannot be drawn out evenly. As described, the direction in which the recesses 19 extend and the longitudinal direction of the contact holes 16 are orthogonal to each other, whereby effects of thin regions of the surface electrode having high sheet resistance are mitigated, and the resistance of the surface electrode may be reduced as compared to an instance in which the direction in which the recesses 19 extend and the longitudinal direction of the contact holes 16 are parallel to each other.

Further, as depicted in FIG. 6, a connection direction (direction of wire bonding) of wires 25 is a direction in which the wires 25 extend and, preferably, may be orthogonal to the direction in which the recesses 19 extend (the x direction). In this instance, a long-side T of a region L where one of the wires 25 is in contact with the source electrode 10 is the direction of wire bonding, and when current flows to the region L from a side S of the semiconductor device 70 in the y-direction, the surface electrode is thin, the number of times that the current passes through the recesses 19 decreases, and the sheet resistance may be reduced. Further, when the region L where the wire 25 is in contact with the source electrode 10 is provided in plural, a fewer number of the recesses 19 with low resistance in the direction of wire bonding (the y-direction) are between adjacent regions L of the regions L. In the example depicted in FIG. 6, two of the regions L are provided and therebetween one recess 19 is provided in the y-direction.

Further, the thickness of the source electrode 10 is increased by the second source electrode 10*b* and thus, damage due to wire bonding may be reduced, the rate of non-conforming products and degradation of characteristics may be reduced. Furthermore, the source electrode 10 becomes thicker and thus, even in a device in which a plated electrode is formed at the surface, permeation of mobile ions in the plating solution may be reduced and the reliability of the semiconductor chip may be enhanced. Furthermore, the recesses 19 are provided in the second source electrode 10*b*, whereby the surface area of the source electrode 10 increases thereby enhancing heat dissipation.

Next, a method of manufacturing the semiconductor device according to the first embodiment is described. FIGS. 7, 8, 9, 10, and 11 are cross-sectional views depicting states of the semiconductor device according to the first embodiment during manufacture. The method of forming the MOS gate structure in the semiconductor chip, at the front surface thereof is a same as that of an existing method and therefore, not depicted. First, the $n^+$-type semiconductor substrate 1 containing silicon and constituting an $n^+$-type drain layer is prepared. Next, on the front surface of the $n^+$-type semiconductor substrate 1, the n-type drift layer 2 having an impurity concentration lower than the impurity concentration of the $n^+$-type semiconductor substrate 1 is epitaxially grown.

Next, on the surface of the n-type drift layer 2, an oxide film mask is formed at a predetermined location by a photolithographic technique and an etching technique. Next, ion implantation of a p-type impurity, for example, boron (B) is performed using the formed oxide film mask as a mask, thereby forming the p-type base layer 5 in the surface layer of the n-type drift layer 2. Concurrently, in the n-type drift layer 2, at the surface thereof, the channel stopper 23 may be formed in an outer side of the edge termination region 60 (opposite an inner side thereof facing the active region 50). The channel stopper 23 may be an n-type or a p-type. The channel stopper 23 may be formed by ion implantation of an n-type impurity such as, for example, phosphorus (P) or a p-type impurity such as, for example, boron (B). Next, in the n-type drift layer 2, at the surface thereof, the p-type RESURF region 24 may be formed in the inner side of the edge termination region 60, near the active region 50, by ion implantation of a p-type impurity such as, for example, boron (B).

Next, on the surface of the p-type base layer 5, an oxide film mask (not depicted) for trench formation and having a predetermined opening width is formed by photolithography. Next, the trenches 18, which reach the n-type drift layer 2, are formed by dry etching.

Next, isotropic etching for removing damage of the trenches 18 and sacrificial oxidation for rounding the bottoms and openings of the trenches 18 are performed. Either the isotropic etching or the sacrificial oxidation alone may be performed. Further, the sacrificial oxidation may be performed after the isotropic etching is performed.

Next, along the surface of the p-type base layer 5 and the bottoms and the sidewalls of the trenches 18, the gate insulating films 7 are formed. The gate insulating films 7 may be formed by thermal oxidation of a temperature of about 1000 degrees C. under an oxygen atmosphere. Further, the gate insulating films 7 may be formed by a deposition method by a chemical reaction such as that for a high temperature oxide (HTO).

Next, on the gate insulating films 7, a polysilicon constituted by a polycrystalline silicon (poly-Si) layer doped with, for example, phosphorus atoms is formed. Next, a portion of the active region 50 is etched, whereby portions of the polysilicon constituting the gate electrodes 8 are left in the trenches 18 and a portion of the polysilicon constituting the conductive film 22 is left in the edge termination region 60. Here, the polysilicon embedded in the trenches 18 may be etched back, may be etched so as to be left inside the trenches 18, below the surface of the n-type drift layer 2, or patterning may be performed, whereby the polysilicon may protrude in an outward direction from the surface of the n-type drift layer 2. As a result, in the edge termination region 60, at least the polysilicon is electrically connected to the gate electrodes 8 in the trenches 18 and the conductive film 22 is left so as to form the field plate covering the field oxide film 20.

Next, on the surface of the p-type base layer 5, a mask having predetermined openings is formed by a photolithographic technique using, for example, a resist. Subsequently, ion-implantation of an n-type impurity is performed by an ion implantation method using the resist mask as a mask. As a result, in the p-type base layer 5, at the surface thereof, the $n^+$-type source regions 6 are formed. Next, the mask used during the ion implantation for forming the $n^+$-type source regions 6 is removed. Next, a heat treatment for activating the $n^+$-type source regions 6 is performed.

In the method of manufacturing described above, after the p-type base layer 5 is formed, the gate structure configured by the trenches 18, the gate insulating films 7, and the gate electrodes 8 is formed, nonetheless, the p-type base layer 5 may be formed after the gate structure is formed. Formation of the p-type base layer 5 after formation of the gate structure may facilitate adjustment of the concentration of the p-type base layer 5. Further, the gate structure configured by the trenches 18, the gate insulating films 7, and the gate electrodes 8 may be formed after the $n^+$-type source regions 6 are formed.

Next, the interlayer insulating film 9 having a thickness of about 1 μm and constituted by, for example, a phosphate glass is deposited so as to cover the gate electrodes 8. Next, the interlayer insulating film 9 is patterned by photolithography, thereby forming the contact holes 16 in which the $n^+$-type source regions 6 and the p-type base layer 5 are exposed. In the active region 50 and the peripheral active region portion 55, the contact holes 16 penetrate through the $n^+$-type source regions 6 and reach the p-type base layer 5 while in the edge termination region 60, the contact holes 16 reach the conductive film 22.

Next, in the p-type base layer 5, at the surface thereof exposed by the contact holes 16, a p-type impurity may be ion-implanted, whereby the $p^{++}$-type contact regions 33 may be formed. The $p^{++}$-type contact regions 33 may be formed directly after the $n^+$-type source regions 6 are formed and the contact holes 16 may be formed so as to penetrate through the interlayer insulating film 9 and the $n^+$-type source regions 6 and be in contact with the $p^{++}$-type contact regions 33.

Figure 7:
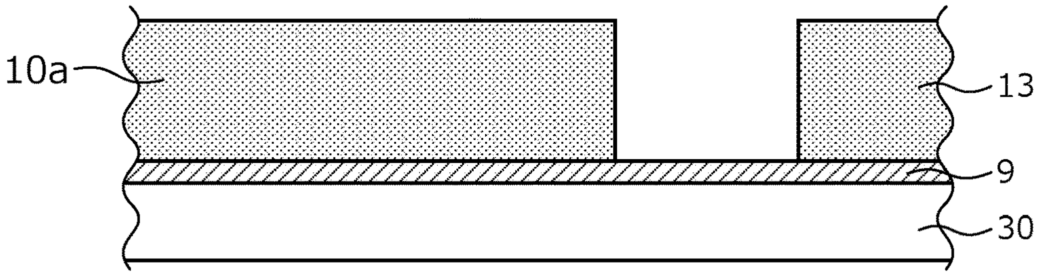
FIG. 7 is a cross-sectional view depicting a state of the semiconductor device according to the first embodiment during manufacture.

Herein, a method of manufacturing the source electrode 10 of the first embodiment is described. First, on the interlayer insulating film 9, a metal film containing aluminum or an alloy with aluminum as a main constituent is deposited by sputtering, etc. Next, the metal film is separated in the active region 50 and the edge termination region 60 as separate electrodes, thereby forming the first source electrode **10*a* and the metal gate electrode 13. The state up to here is depicted in FIG. 7. In FIGS. 7 to 11, a semiconductor chip 30** is depicted and details of the internal MOS structure are not depicted.

Before the metal film is deposited, the barrier metal 15 constituted by a titanium film (Ti), a titanium nitride (TiN) film, or a stacked film including both (for example, Ti/TiN, etc.) may be formed by sputtering. The contact plugs 14 may be embedded in the contact holes 16, via the barrier metal 15. A material of the contact plugs 14 may be tungsten (W). The contact plugs 14 may be formed by forming a tungsten film by a CVD method and thereafter, etching back the tungsten film. During etch-back, the barrier metal 15 may also be etched back or the barrier metal 15 may be left, without being etched back. At this time, use of the trench contact structure enables suppression of parasitic bipolar operation and thus, is preferable. Here, the trench contact structure is a contact structure in which the contact plugs 14 are embedded in the contact holes 16 that penetrate through the interlayer insulating film 9 and the $n^+$-type source regions 6, to be in contact with the $p^{++}$-type contact regions 33.

Figure 8:
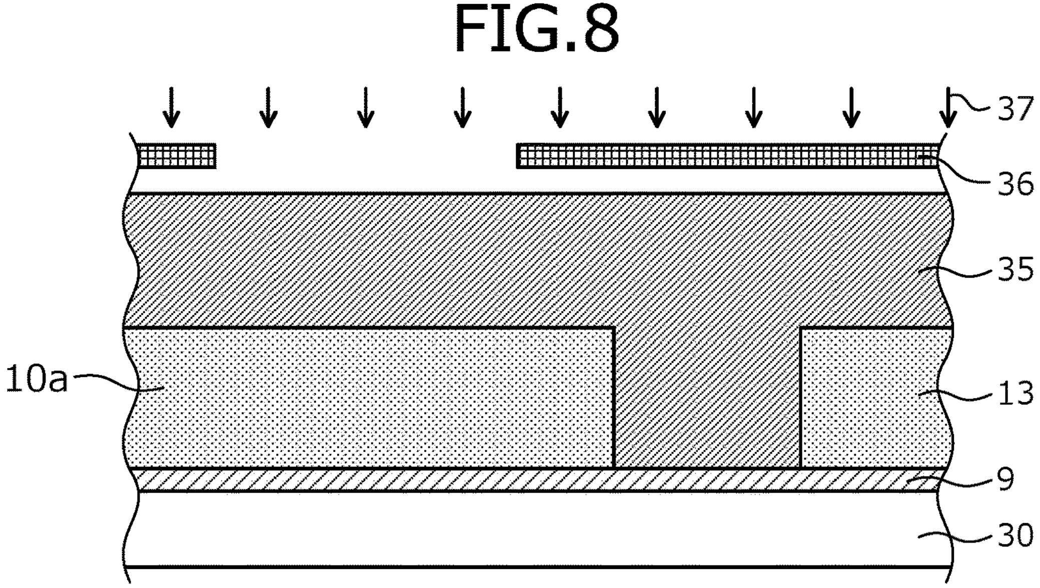
FIG. 8 is a cross-sectional view depicting a state of the semiconductor device according to the first embodiment during manufacture.
Figure 9:
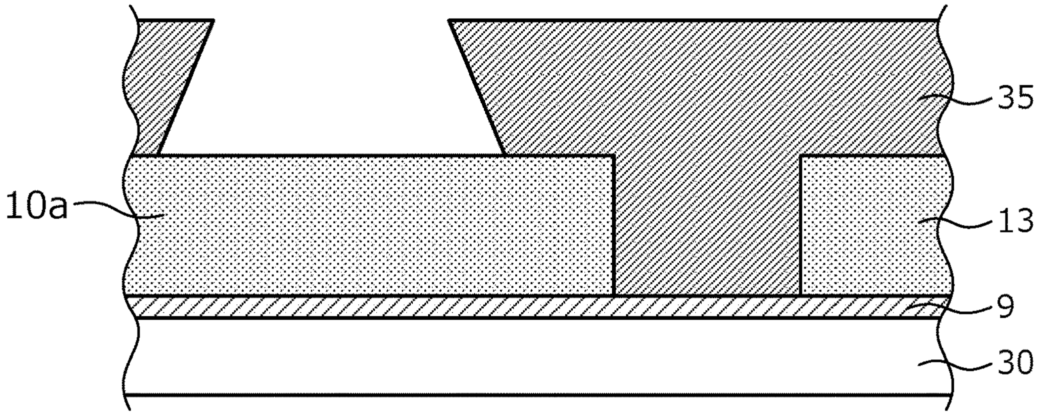
FIG. 9 is a cross-sectional view depicting a state of the semiconductor device according to the first embodiment during manufacture.

Next, a liftoff resist 35 is applied on the first source electrode **10*a*, the metal gate electrode 13, and the interlayer insulating film 9; a mask 36 is formed having openings at regions where the second source electrode 10*b* is to be formed; and optical exposure 37 is performed. The openings are formed so as to have a longitudinal direction in a direction orthogonal to the longitudinal direction of the contact holes 16. The state up to here is depicted in FIG. 8. Next, the liftoff resist 35 is patterned, thereby removing the resist 35 of the regions where the second source electrode 10*b* is to be formed. The state up to here is depicted in FIG. 9**.

Figure 10:
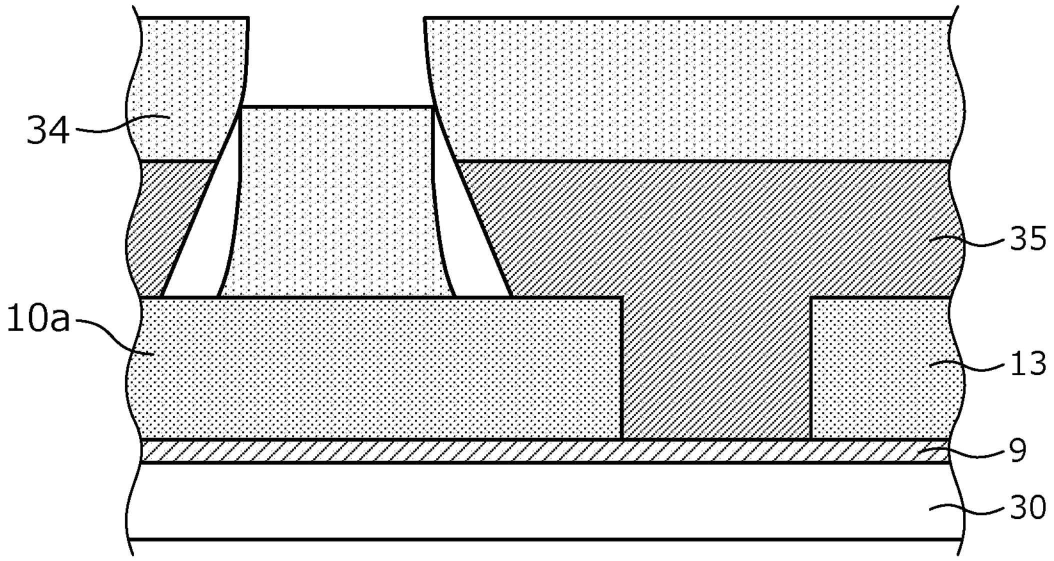
FIG. 10 is a cross-sectional view depicting a state of the semiconductor device according to the first embodiment during manufacture.

Next, a metal film 34 such as aluminum or an alloy with aluminum as a main constituent is deposited on the liftoff resist 35 by sputtering or the like. In the openings of the liftoff resist 35, a metal film 34 is deposited on the first source electrode 10*a*. The state up to here is depicted in FIG. 10.

Figure 11:
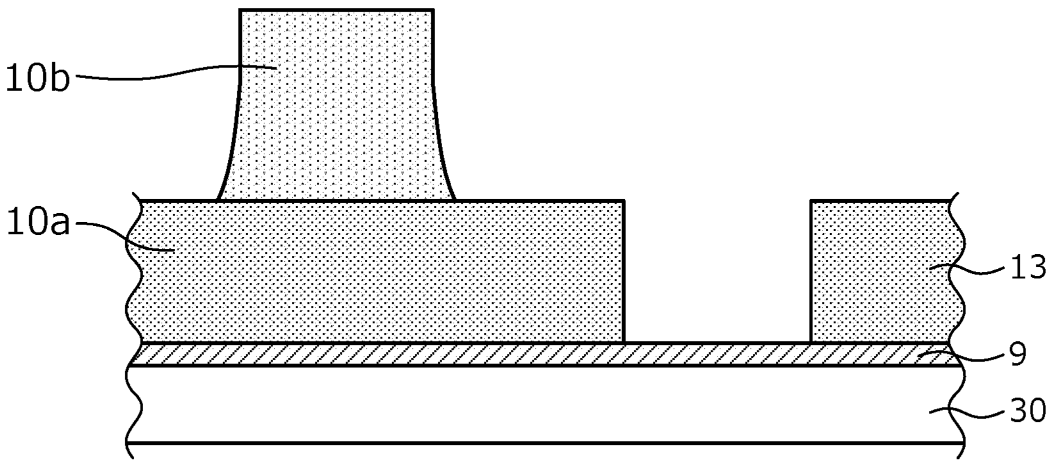
FIG. 11 is a cross-sectional view depicting a state of the semiconductor device according to the first embodiment during manufacture.

Next, the metal film 34 deposited on the liftoff resist 35 and the liftoff resist 35 are removed (lifted off), thereby forming the second source electrode 10*b*. The state up to here is depicted in FIG. 11. As a result, in the active region 50, the source electrode 10 is connected to the $n^+$-type source regions 6 and the $p^{++}$-type contact regions 33, via the barrier metal 15 and the contact plugs 14. In the peripheral active region portion 55, the source electrode 10 is connected to the p-type base layer 5, via the barrier metal 15 and the contact plugs 14. In the edge termination region 60, the metal gate electrode 13 is connected to the conductive film 22, via the barrier metal 15 and the contact plugs 14. As described, in the first embodiment, the metal film 34 is lifted off, whereby the second source electrode 10*b* having the recesses that extend in the direction orthogonal to the longitudinal direction of the contact holes 16 is formed on the first source electrode 10*a* and regions are formed having a thickness that is about twice as thick as compared to a normal source electrode.

Next, at a surface of the $n^+$-type semiconductor substrate 1 (the back surface of the semiconductor chip), for example, a metal film such as that containing nickel (Ni), titanium (Ti), gold (Au), silver (Ag), aluminum (Al), an alloy with aluminum as a main constituent, etc., or a stacked film of a combination thereof (for example, Ti/Ni/Au, Al/Ti/Ni/Au, etc.) is deposited as the back electrode 11. Subsequently, a heat treatment is performed, thereby forming an ohmic contact between the $n^+$-type semiconductor substrate 1 and the back electrode 11. As a result, the trench-type MOSFET 70 depicted in FIGS. 1 to 4 is completed.

As described, according to the first embodiment, the source electrode has a two-layer structure including the first source electrode provided on the interlayer insulating film and the second source electrode provided on the first source electrode, and the second source electrode has the recesses that extend in the direction orthogonal to the longitudinal direction of the contact holes. As a result, regions that are about twice as thick compared to a normal source electrode are present and current that flows through the thick regions increases, whereby the resistance of the surface electrode, which includes the first source electrode and the second source electrode, may be reduced.

Figure 12:
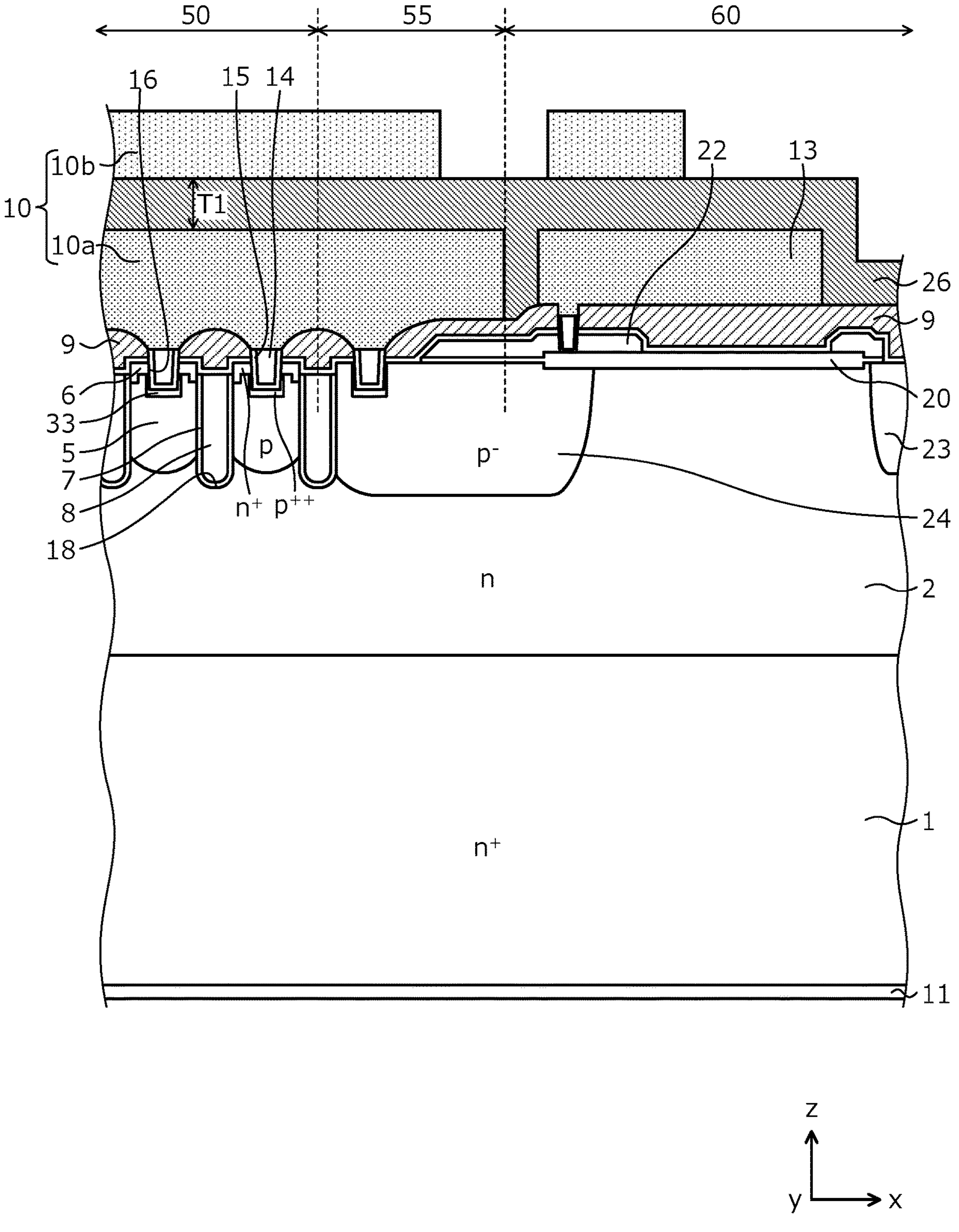
FIG. 12 is a cross-sectional view depicting a structure of a semiconductor device according to a second embodiment along cutting line X1-X1 in FIG. 1.
Figure 13:
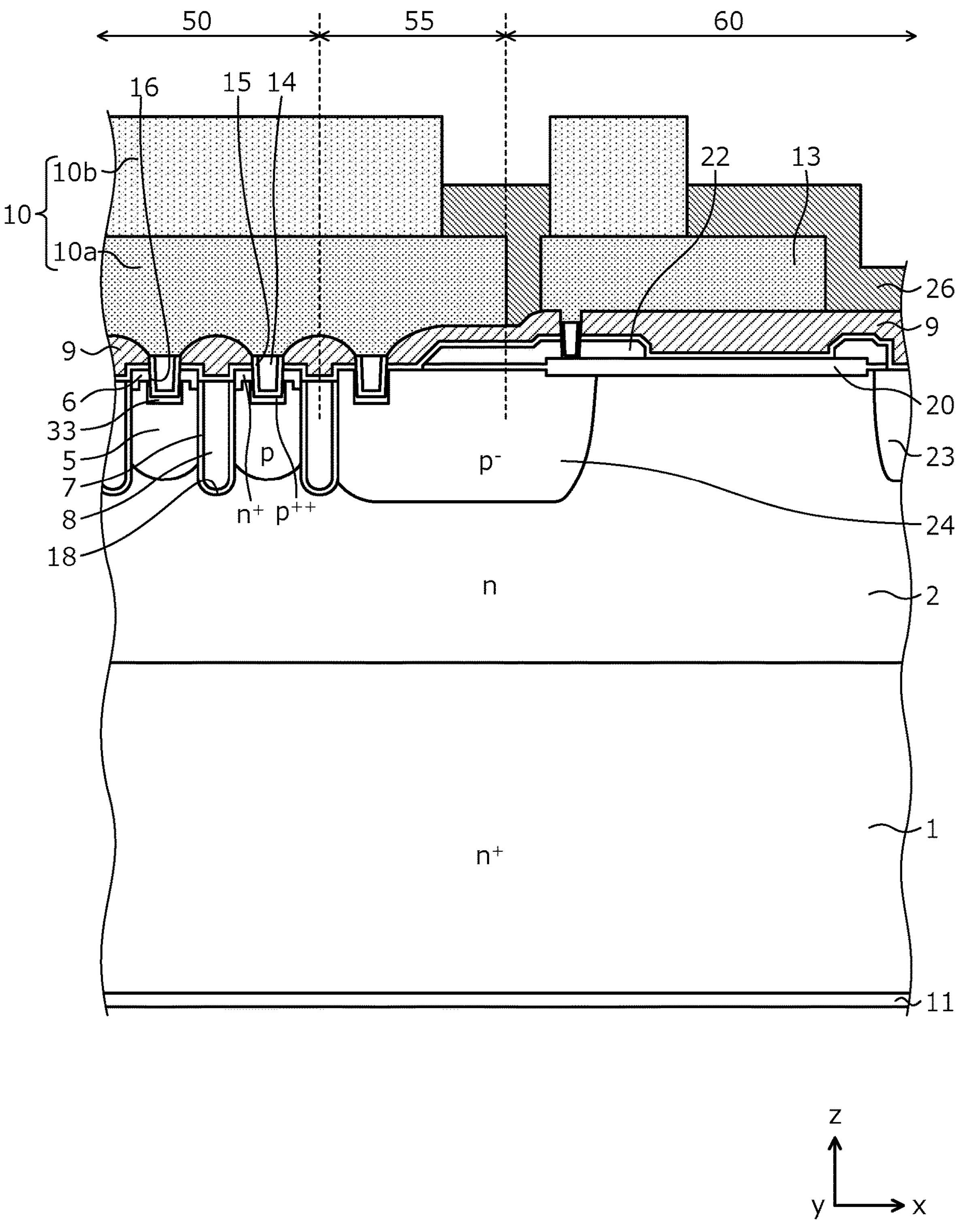
FIG. 13 is a cross-sectional view depicting the structure of the semiconductor device according to the second embodiment along cutting line X2-X2 in FIG. 1.
Figure 14:
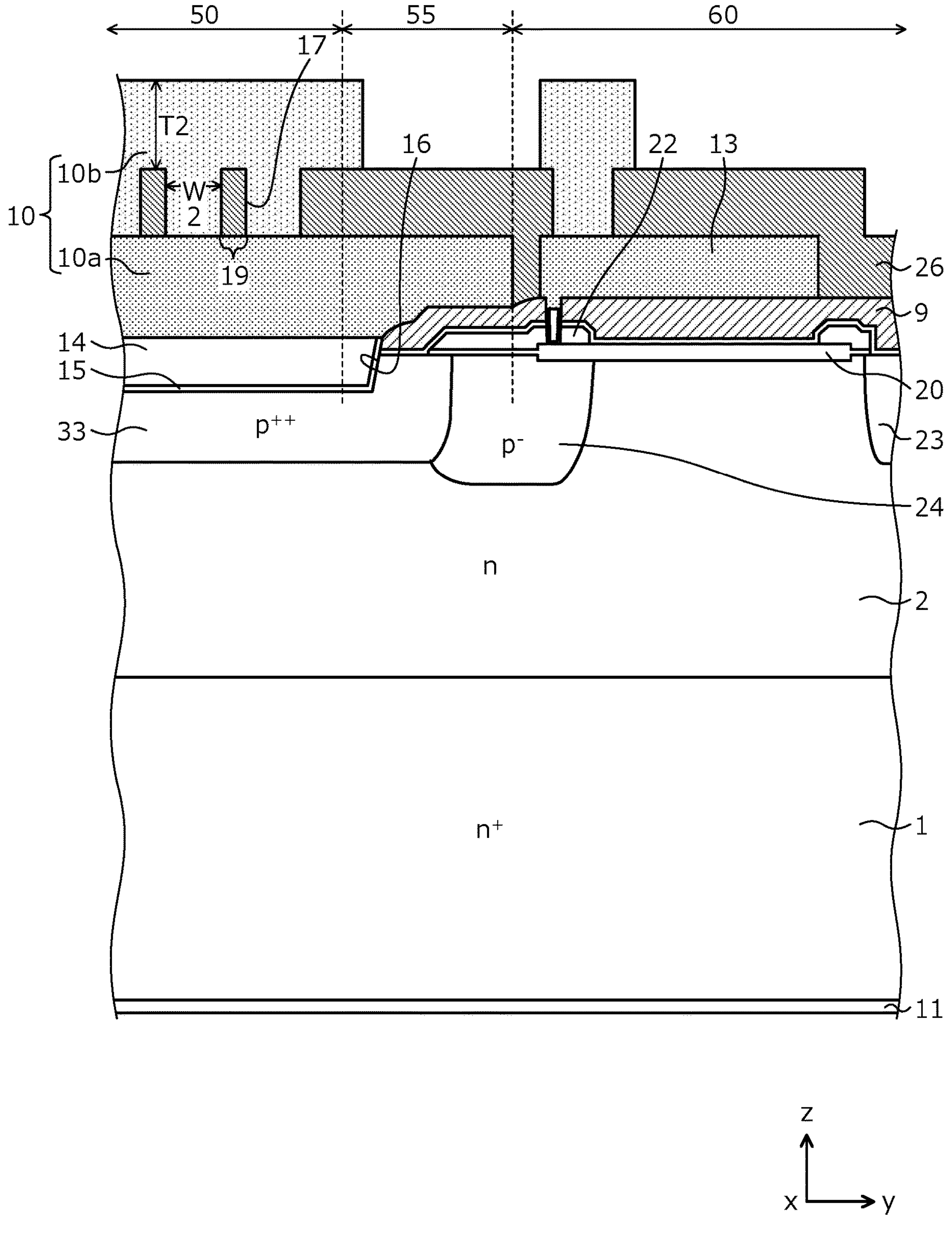
FIG. 14 is a cross-sectional view depicting the structure of the semiconductor device according to the second embodiment along cutting line Y1-Y1 in FIG. 1.

Next, a second embodiment is described. An enlarged plan view depicting a structure of a semiconductor device according to the second embodiment is the same as that of the first embodiment depicted in FIG. 1 and thus, is not separately depicted. FIG. 12 is a cross-sectional view depicting the structure of the semiconductor device according to the second embodiment along cutting line X1-X1 in FIG. 1. FIG. 13 is a cross-sectional view depicting the structure of the semiconductor device according to the second embodiment along cutting line X2-X2 in FIG. 1. FIG. 14 is a cross-sectional view depicting the structure of the semiconductor device according to the second embodiment along cutting line Y1-Y1 in FIG. 1.

As depicted in FIG. 14, in the second embodiment, the second source electrode 10*b*, at a side thereof facing the first source electrode 10*a*, has the recesses 19 that extend in a direction (the x direction) orthogonal to the longitudinal direction of the contact holes 16 (the y-direction). An insulating film 26 is embedded between adjacent ones of the recesses 19 of the second source electrode 10*b*. As described, the insulating film 26 is provided in the source electrode 10, whereby a thick region of the surface electrode configured by the first source electrode 10*a* and the second source electrode 10*b*, and a region where the thickness of the surface electrode is normal may be provided equally. Further, the thicknesses, materials, etc. of the first source electrode 10*a* and the second source electrode 10*b* are the same as those of the first embodiment.

Further, in the active region 50 and the peripheral active region portion 55, preferably, a thickness T1 of the insulating film 26 may be in a range of 1 μm to 5 μm (refer to FIG. 12). Further, a thickness T2 of the second source electrode 10*b* on the insulating film 26, preferably, may be 0.5 times to 5 times a width W2 (distance between portions of the insulating film 26) of a contact hole 17 of the insulating film 26 (refer to FIG. 14). As described hereinafter, when sidewalls of the portions of the insulating film 26 are used to embed the metal film 34, this range of values are set, whereby the metal film 34 may be embedded in each contact hole 17, free of voids, and the second source electrode 10*b* may be formed in each contact hole 17.

As described, in the second embodiment, similar to the first embodiment, regions are present that are about twice as thick as compared to a normal source electrode and current that flows in the thick regions increases, whereby the resistance of the surface electrode may be reduced.

Next, a method of manufacturing the semiconductor device according to the second embodiment is described. FIGS. 15, 16, 17, 18, 19, 20, 21, 22, 23, 24, and 25 are cross-sectional views depicting states of the semiconductor device according to the second embodiment during manufacture. Similar to the first embodiment, first, the $n^+$-type semiconductor substrate 1 containing silicon and constituting the $n^+$-type drain layer is prepared, the n-type drift layer 2 and the p-type base layer 5 are formed, and in the p-type base layer 5, the trench MOS structure configured by the $n^+$-type source regions 6, the $p^{++}$-type contact regions 33, the trenches 18, the gate insulating films 7, and the gate electrodes 8 is formed. Next, similar to the first embodiment, the interlayer insulating film 9 is formed on the MOS structure and the contact structure in which the contact plugs 14 are embedded is formed.

Figure 15:
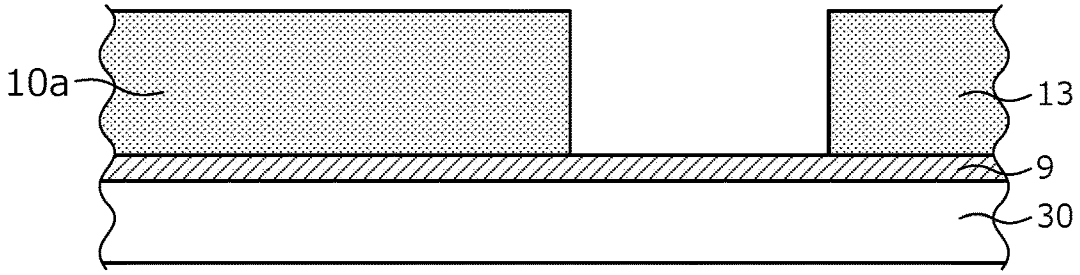
FIG. 15 is a cross-sectional view depicting a state of the semiconductor device according to the second embodiment during manufacture.

Next, the metal film such as that containing aluminum or an alloy with aluminum as a main constituent, or an alloy with copper as a main constituent, etc. is deposited by sputtering or the like. Next, the metal film is separated in the active region 50 and the edge termination region 60 as separate electrodes, thereby forming the first source electrode 10*a* and the metal gate electrode 13. The state up to here is depicted in FIG. 15. In FIGS. 15 to 25, the semiconductor chip 30 is depicted and details of the internal MOS structure are not depicted.

Figure 16:
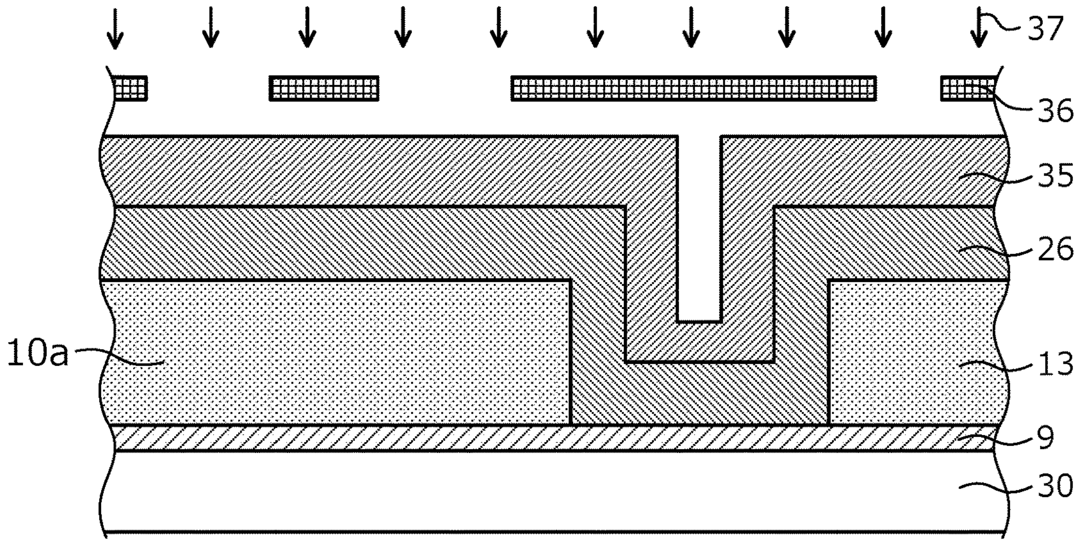
FIG. 16 is a cross-sectional view depicting a state of the semiconductor device according to the second embodiment during manufacture.

Next, the insulating film 26 is formed on the first source electrode 10*a*, the metal gate electrode 13, and the interlayer insulating film 9; the resist 35 is applied on the insulating film 26; the mask 36 having openings in regions where the second source electrode 10*b* is to contact the first source electrode 10*a* is formed; and the optical exposure 37 is performed. The openings are formed having a longitudinal direction orthogonal to the longitudinal direction of the contact holes 16. Further, the insulating film 26 is formed by, for example, inorganic $SiO_2$, SiN or an organic polyimide resin (PI). The state up to here is depicted in FIG. 16.

Figure 17:
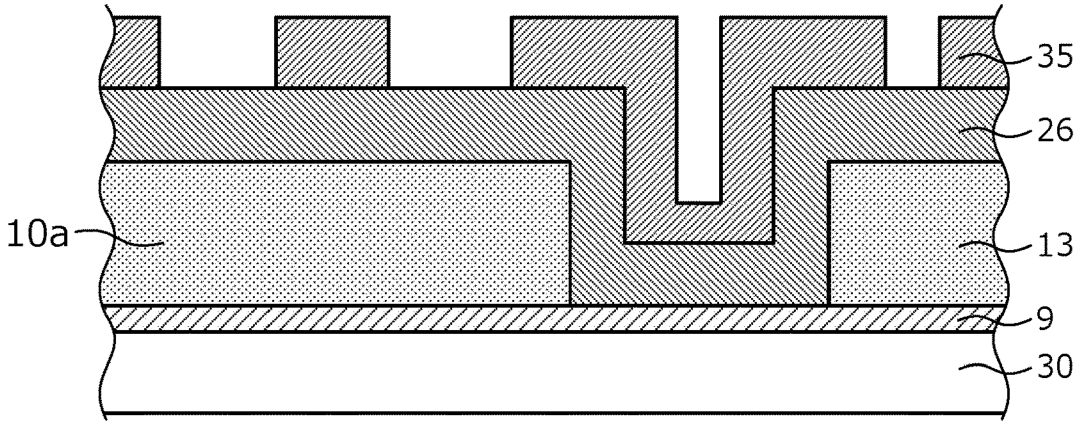
FIG. 17 is a cross-sectional view depicting a state of the semiconductor device according to the second embodiment during manufacture.
Figure 18:
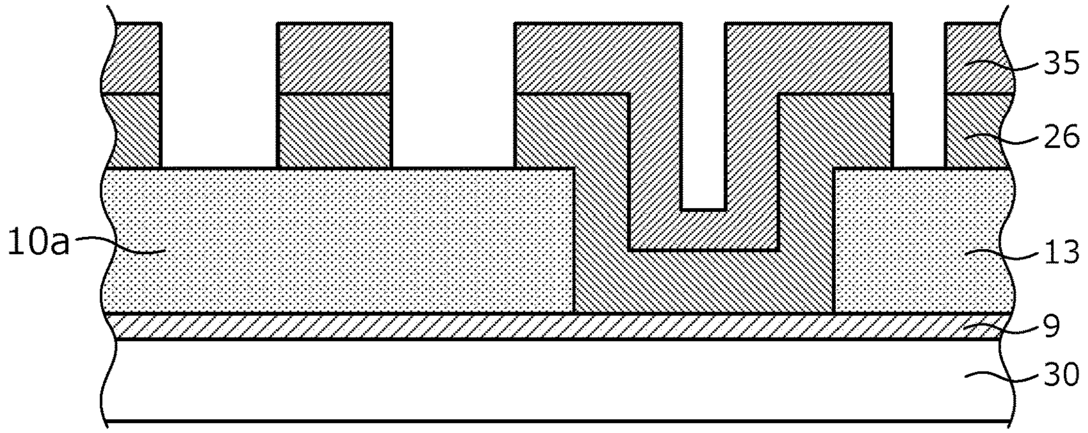
FIG. 18 is a cross-sectional view depicting a state of the semiconductor device according to the second embodiment during manufacture.
Figure 19:
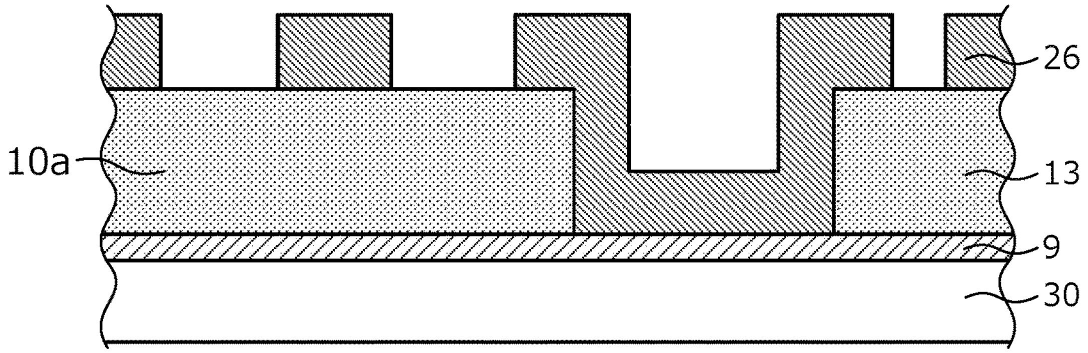
FIG. 19 is a cross-sectional view depicting a state of the semiconductor device according to the second embodiment during manufacture.

Next, the resist 35 is patterned and the resist 35 of the regions where the second source electrode 10*b* is to be in contact with the first source electrode 10*a* is removed. The state up to here is depicted in FIG. 17. Next, the insulating film 26 is etched, thereby partially exposing the first source electrode 10*a*. The state up to here is depicted in FIG. 18. Next, the resist 35 is peeled, thereby exposing the insulating film 26. As a result, the insulating film 26 having a longitudinal direction orthogonal to the longitudinal direction of the contact holes 16 is formed. The state up to here is depicted in FIG. 19.

Figure 20:
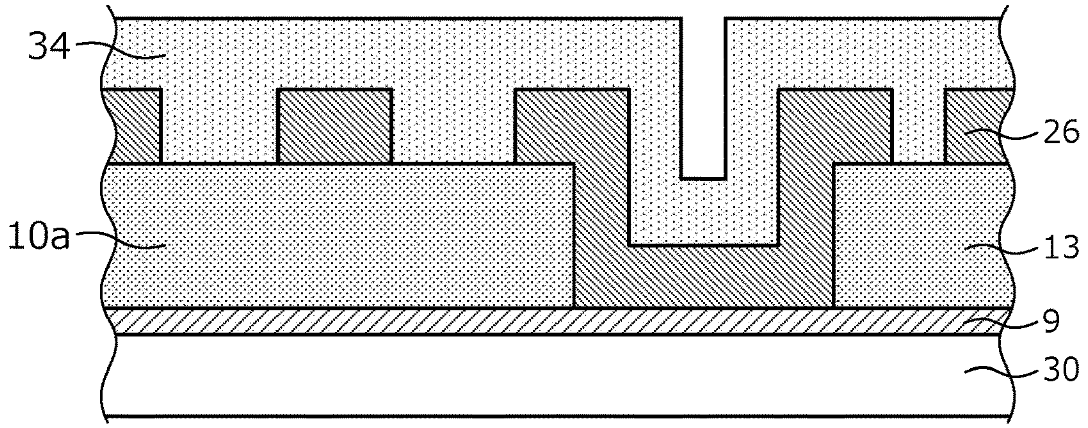
FIG. 20 is a cross-sectional view depicting a state of the semiconductor device according to the second embodiment during manufacture.

Next, the metal film 34 containing aluminum or an alloy with aluminum as a main constituent, etc. is deposited on the insulating film 26 and the first source electrode 10*a* by sputtering or the like. In the openings of the insulating film 26, the metal film 34 is deposited on the first source electrode 10*a*. The state up to here is depicted in FIG. 20.

Figure 21:
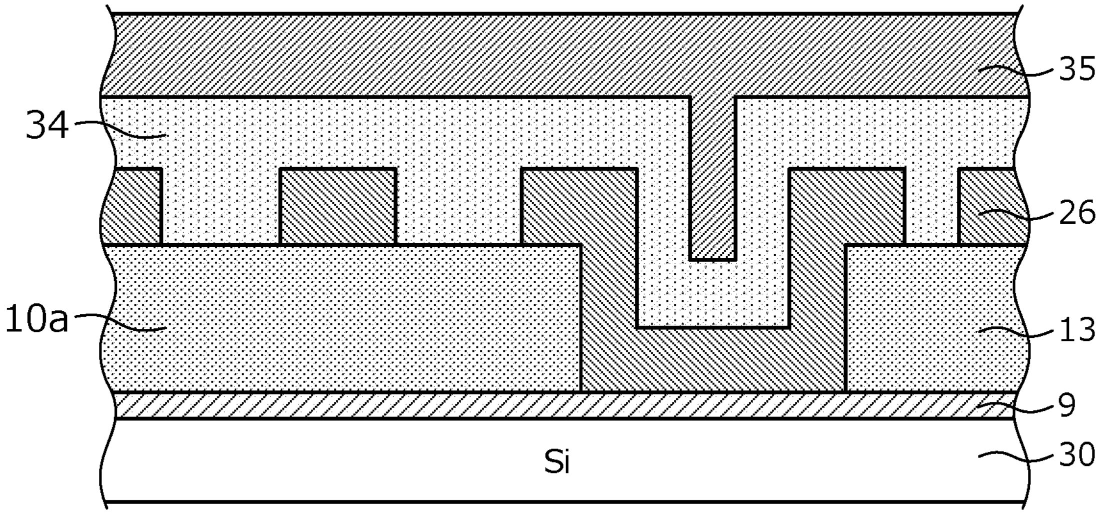
FIG. 21 is a cross-sectional view depicting a state of the semiconductor device according to the second embodiment during manufacture.
Figure 22:
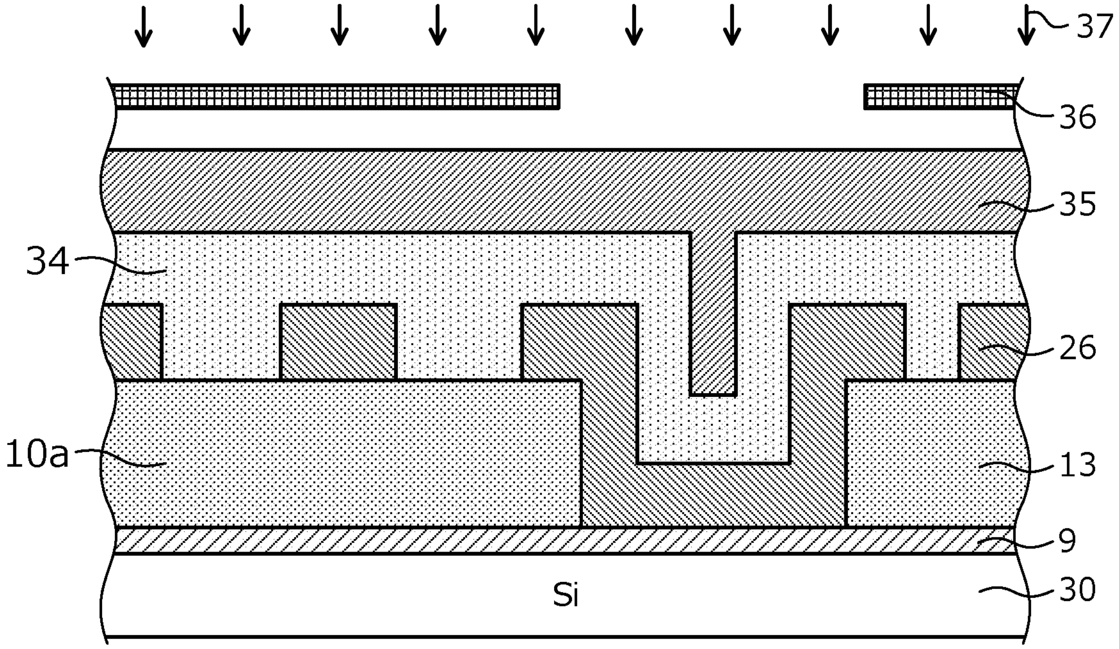
FIG. 22 is a cross-sectional view depicting a state of the semiconductor device according to the second embodiment during manufacture.
Figure 23:
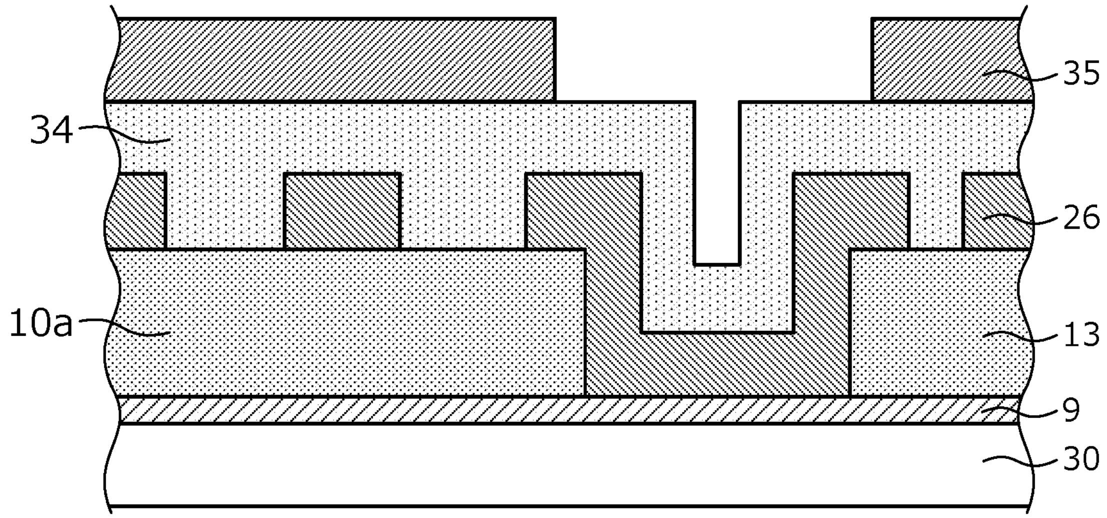
FIG. 23 is a cross-sectional view depicting a state of the semiconductor device according to the second embodiment during manufacture.
Figure 24:
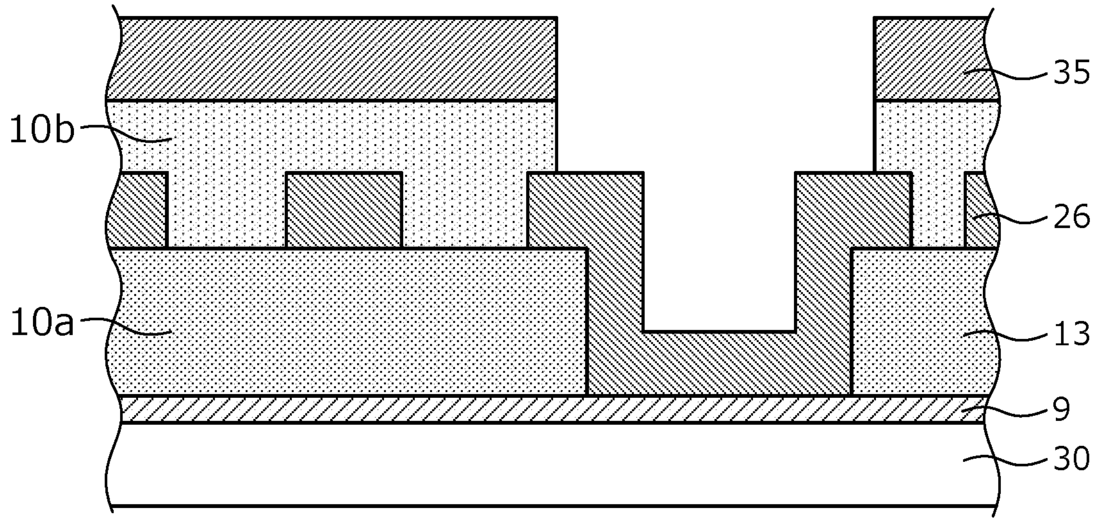
FIG. 24 is a cross-sectional view depicting a state of the semiconductor device according to the second embodiment during manufacture.
Figure 25:
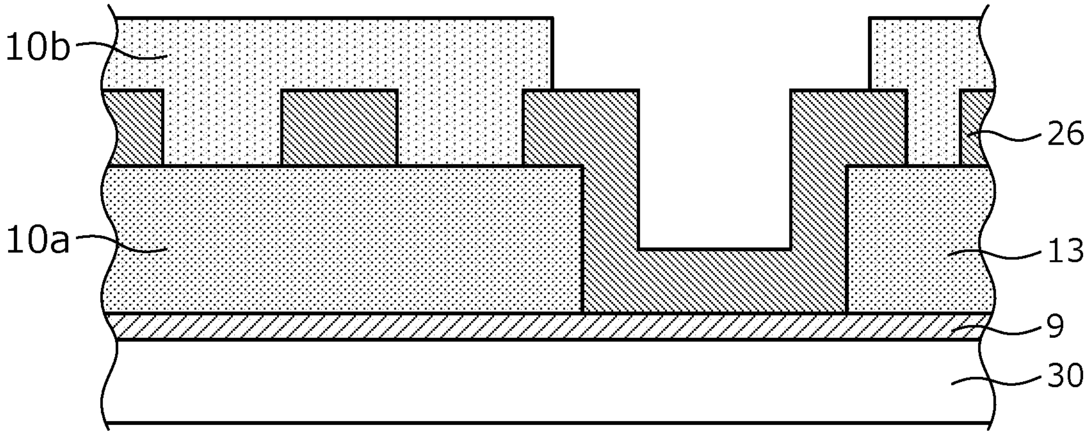
FIG. 25 is a cross-sectional view depicting a state of the semiconductor device according to the second embodiment during manufacture.

Next, the resist 35 is applied on the metal film 34. The state up to here is depicted in FIG. 21. Next, the mask 36 having an opening in a region corresponding to the peripheral active region portion 55 is formed and the optical exposure 37 is performed. The state up to here is depicted in FIG. 22. Next, the resist 35 is patterned, thereby forming an opening in the region corresponding to the peripheral active region portion 55. The state up to here is depicted in FIG. 23. Next, the metal film 34 is separated in the active region 50 and the edge termination region 60 as separate electrodes, thereby forming the second source electrode 10*b* and the metal gate electrode 13. The state up to here is depicted in FIG. 24. Next, the resist 35 is peeled, exposing the second source electrode 10*b* and the metal gate electrode 13. The state up to here is depicted in FIG. 25.

As described, in the second embodiment, the patterned insulating film 26 is formed, the metal film 34 is embedded in the insulating film 26, and the sidewalls of the portions of the insulating film 26 are used, whereby the second source electrode 10*b* having the recesses 19 extending in the direction orthogonal to the longitudinal direction of the contact holes 16 is formed on the first source electrode 10*a* and regions that are about twice as thick as a normal source electrode are formed. Thereafter, similar to the first embodiment, the back electrode 11 is formed. As a result, the trench-type MOSFET 70 depicted in FIGS. 12 to 14 is completed.

In the described method of manufacturing according to the second embodiment, while the metal gate electrode 13 is also formed having the same structure as that of the source electrode 10 and is a two-layered electrode having the recesses 19 that face the upper electrode with the insulating film 26 intervening therebetween, the metal gate electrode 13 may be a single layer having a thickness that is the same as that of the first source electrode 10*a*. A reason for this is that a large current like that of the source electrode 10 does not flow through the metal gate electrode 13.

As described, according to the second embodiment, the second source electrode has, on the side thereof facing the first source electrode, the recesses that extend in the direction orthogonal to the longitudinal direction of the contact holes, and the recesses between the adjacent portions of the second source electrode are embedded with the insulating film. Thus, the thick regions of the surface electrode and the regions where the thickness the surface electrode are normal may be equally provided.

In the foregoing, while the present invention is described taking, as an example, an instance in which the MOS gate structure is configured on a first main surface of a silicon substrate, without limitation hereto, various modifications are possible such as in the type of semiconductor (for example, silicon carbide (SiC) or the like), orientation of a main surface of the substrate, etc. Further, in the embodiments of the present invention, while a trench-type MOSFET is described as an example, without limitation hereto, application is possible to various types of semiconductor devices such as planar-type MOSFETs, MOS-type semiconductor devices such as IGBTs, diodes, etc. Further, in the present invention, while in the embodiments, the first conductivity type is assumed to be an n-type and the second conductivity type is assumed to be a p-type, the present invention is similarly implemented when the first conductivity type is a p-type and the second conductivity type is an n-type.

The semiconductor device and the method of manufacturing a semiconductor device of the embodiments of the present invention achieve an effect in that surface electrode resistance of the semiconductor chip may be reduced.

As described, the semiconductor device and the method of manufacturing a semiconductor device according to the present invention are useful for high-voltage semiconductor devices used in power converting equipment, power source devices used in various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:

a semiconductor substrate of a first conductivity type and having a first main surface and a second main surface opposite to each other;

a drift layer of the first conductivity type, provided on the first main surface of the semiconductor substrate;

a base layer of a second conductivity type, provided in the drift layer at a surface thereof;

a plurality of source regions of the first conductivity type, selectively provided in the base layer at a surface thereof;

a plurality of gate electrodes, provided at the surface of the base layer and surfaces of the plurality of source regions, via a plurality of gate insulating films, respectively;

an interlayer insulating film covering the plurality of source regions and the plurality of gate electrodes;

a plurality of contact holes provided in the interlayer insulating film and in the plurality of source regions at the surfaces thereof, a longitudinal direction of each of the plurality of contact holes being a first direction; and a front electrode provided on the interlayer insulating film, wherein the front electrode is configured by a lower electrode provided on the interlayer insulating film, and an upper electrode provided on the lower electrode, the upper electrode having a plurality of recesses formed therein each extending in a second direction orthogonal to the first direction.

2. The semiconductor device according to claim 1, wherein the upper electrode forms a stripe pattern in which a longitudinal direction of each stripe is in the second direction.

3. The semiconductor device according to claim 1, wherein the plurality of contact holes forms a striped pattern in which a longitudinal direction of each stripe is in the first direction.

4. The semiconductor device according to claim 1, further comprising a conductive wire connected to the front electrode, wherein a connection direction of the conductive wire is the first direction.

5. The semiconductor device according to claim 4, wherein a width of each of the plurality of recesses in a lateral direction thereof is smaller than a diameter of the conductive wire.

6. The semiconductor device according to claim 1, wherein a surface of the lower electrode in contact with the upper electrode is flatter than a surface of the interlayer insulating film.

7. The semiconductor device according to claim 1, wherein the lower electrode contains Al—Si, Al—Si—Cu, or Al—Cu.

8. The semiconductor device according to claim 1, wherein the upper electrode contains Al—Si, Al—Si—Cu, Al—Cu, Al, or Cu.

9. The semiconductor device according to claim 1, wherein the plurality of recesses are provided in the upper electrode, at a surface thereof in contact with the lower electrode, and adjacent two of the plurality of recesses have an insulating film embedded therebetween.

10. The semiconductor device according to claim 9, wherein a thickness of the upper electrode on the insulating film is in a range of 0.5 times to 5 times a distance between the adjacent two of the plurality of recesses.

11. The semiconductor device according to claim 9, wherein the insulating film contains inorganic $SiO_2$, SiN, or an organic polyimide resin.

12. A method of manufacturing a semiconductor device, the method comprising:

providing a semiconductor substrate of a first conductivity type, the semiconductor substrate having a first main surface and a second main surface opposite to each other;

forming a drift layer of the first conductivity type on the first main surface of the semiconductor substrate;

forming a base layer of a second conductivity type in the drift layer at a surface thereof;

selectively forming a plurality of source regions of the first conductivity type, in the base layer at a surface thereof;

forming a plurality of gate electrodes at the surface of the base layer and surfaces of the plurality of source regions, via a plurality of gate insulating films, respectively;

forming an interlayer insulating film covering the plurality of source regions and the plurality of gate electrodes;

forming, in the interlayer insulating film and in the plurality of source regions at the surfaces thereof, a plurality of contact holes, a longitudinal direction of each of the plurality of contact holes being a first direction; and forming a front electrode on the interlayer insulating film, including:

forming a lower electrode on the interlayer insulating film, and forming, on the lower electrode, an upper electrode having a plurality of recesses each extending in a second direction orthogonal to the first direction.

13. The method according to claim 12, wherein the forming the front electrode further includes, after forming the lower electrode on the interlayer insulating film:

forming a resist on the lower electrode, forming, in the resist, a plurality of openings reaching the lower electrode, forming a metal film on the resist and in the plurality of openings, and removing the resist and the metal film on the resist, thereby forming the upper electrode on the lower electrode.

14. The method according to claim 12, wherein the forming the front electrode further includes, after forming the lower electrode on the interlayer insulating film:

forming an insulating film on the lower electrode, forming, in the insulating film, a plurality of openings reaching the lower electrode, and forming a metal film on the insulating film and in the plurality of openings, thereby forming the upper electrode on the lower electrode.

* * * * *